US005457452A

United States Patent [19]

Skovronski

[11] Patent Number: 5,457,452
[45] Date of Patent: Oct. 10, 1995

[54] SPLIT KEYBOARD ADJUSTMENT SYSTEM

[76] Inventor: Martin J. Skovronski, 18117 270th St., Eldridge, Iowa 52748

[21] Appl. No.: 901,975

[22] Filed: Jun. 22, 1992

[51] Int. Cl.[6] .......... H03K 17/94

[52] U.S. Cl. .......... 341/22; 400/489

[58] Field of Search .......... 341/22, 23, 21; 400/489; 200/5 A

[56] References Cited

U.S. PATENT DOCUMENTS

| | | | |
|---|---|---|---|
| 3,990,565 | 11/1976 | Felton et al. | 400/83 X |
| 4,064,560 | 12/1977 | Baxter | 341/22 |
| 4,483,634 | 11/1984 | Frey et al. | 400/489 |
| 4,633,227 | 12/1986 | Menn | 341/22 |
| 5,067,834 | 11/1991 | Szmanda et al. | 400/489 |
| 5,197,811 | 3/1993 | Levinrad | 400/489 |
| 5,228,791 | 7/1993 | Fort | 400/489 |

*Primary Examiner*—Brent Swarthout
*Assistant Examiner*—Thomas J. Mullen, Jr.
*Attorney, Agent, or Firm*—Frank C. Price

[57] ABSTRACT

A split keyboard adjustment system for left hand and right hand keyboards which can be separated allows each to be rotated independently about three axes. The purpose is to allow the operator a maximum of flexibility in setting the positions of his keyboards for his comfort or for a change of position of his arms, wrists and hands.

1 Claim, 1 Drawing Sheet

SPLIT KEYBOARD ADJUSTMENT SYSTEM

FIELD OF THE INVENTION

The field of this invention is keyboards for finger actuation such as on typewriters, word processors, computers and calculators. It could also include computerized controls of operations of systems. The focus of the invention is the position of the keyboard relative to the arms and hands regardless of the mechanical or electrical action stemming from depression of the keys by the fingers.

BACKGROUND OF THE INVENTION

Keyboards normally have parallel rows of keys. They are used mostly with the rows parallel to the shoulders of the operator, the rows proceeding upward away from the operator. While this layout has certainly been "human engineered" for fast finger action, the keyboard requires a single, somewhat rigid and unnatural stance for the hands, always the same, day after day for operators who are steadily employed at the keyboard. There is quite a variety of adjustable chairs to provide seating comfort for an operator. However, nothing has been done to allow adjustment of the keyboard to an operator's liking or even changes in the adjustment from time to time.

There is need for an adjustable keyboard which can present the most convenient or non-stressful stance for the hands and arms of each individual operator Ever) more, if the keyboard can be arranged to require more arm movement, without sacrificing speed, it would allow a relieving of the stress caused by current keyboards which require almost rigid arm stance during use. If the required stance can also be varied from time to time for a given operator by small changes in where the arms and hands are held during operation, this might preclude the development of physiological problems in the limbs and back of an operator who works day in and day out at the keyboard.

SUMMARY OF THE INVENTION

This invention provides adjustments for split keyboards, one for each hand, which can be customized by each operator (1) for the distance the hands are comfortably apart (2) for the desired height of the hands above the table top (3) for the keyboards' rotational orientation which affects the twist of the forearms (4) for the angle between the two planes of the keyboards (5) for the angle of the plane of each keyboard above the horizontal and (6) for the locations where each of the hands is held during operation. Thus, a particular operator can adjust the keyboard fully to his liking and he can vary the positions from time to time to allow relief to his joints and tendons after operating continuously in one position. Changes from time to time might preclude the development of irritation in the operator's hands, wrists or forearms. If nothing else, the changes would give variety to the task in the physical sense.

The variety of adjustments for the split keyboards is accomplished by having the separate right and left hand keyboards halves mounted with joints and supports which are fully adjustable in the several dimensions: height, distance apart and rotation about three axes.

The invention starts with a base which would sit on a table or desk, or it could be a table or desk top. A vertical post mounts on the base providing a range of height for a ring sliding on the post. The ring can be pinned or clamped to the post at a particular height preferred by the operator. The two, right hand and left hand, keyboards are each attached to the ring by a system of double stiff universal joints allowing the keyboards to be tilted, twisted and spread apart to various degrees. The system can also include, for each keyboard, an adjustable extension to allow setting the distance of the keyboards from the post.

In one version of the invention the right/left keyboards are adjustable outward from each other from an initial position of being butted against each other as in a conventional, single keyboard. An operator, new to the split keyboard, can start using the keyboard in conventional geometry and then gradually moving the keyboards apart, as desired, except without any upset to coordination or automatic key location by the fingers.

DESCRIPTION OF THE PREFERRED EMBODIMENT

Figure 1:
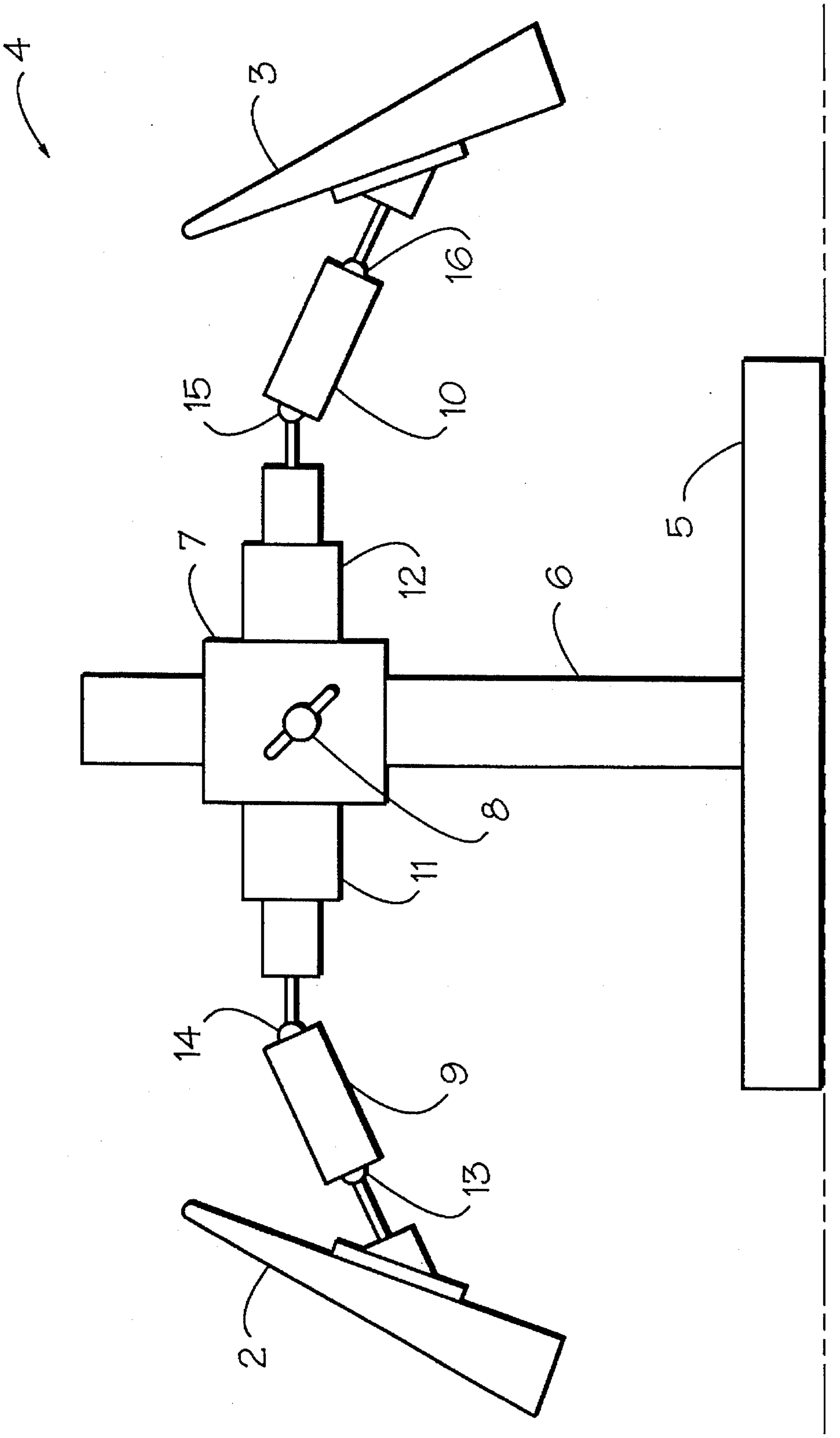
FIG. 1 shows the keyboards with the adjustable mounting system. The keyboards are shown in profile to allow a full view of the mounting system. Also, to simplify the view the mountings of each keyboard are positioned 180 degrees apart.

The subject invention of an adjustable, split keyboard is explained in the figure. Any two-handed keyboard might be split as suggested by this invention. As an example, one particular keyboard key system and layout is used to illustrate the invention.

FIG. 1 illustrates a system to provide means to adjust the two halves of the keyboard in a broad scope of spatial relationships: separation distance of the two halves, rotation of each half, 2 and 3, about any of three axes, angle of the two halves relative to one another and height of the halves above a table top.

The system shown in FIG. 1 sits on a table top indicated by the phantom line in the FIG. 1. The system has a base 5, a post 6, a sliding collar 7 with a lock bolt 8, and two stiff, double universal joint units, 9 and 10, one for each half of the total keyboard. The universal joints, themselves, are 13, 14, 15, and 16. The keyboards would never be used in the extreme positions shown in FIG. 1 which is arranged to show a profile view of the mounting system. Again, for simplicity, the two mountings, 11 and 12, are seen in FIG. 1 at 180 degrees apart for drawing and view simplicity. It is expected that the optimum angle between the axes 1 and 12 would be approximately 135 degrees. Depending upon the length of the "U" joint systems, other angles between 180 and 90 degrees could be workable.

There are many possible angles between the mountings 11 and 12 and the length of the mountings 11 and 12 to allow adequate movement of the halves 2 and 3 of the keyboards 2 and 3. Furthermore, not shown, the mountings 11 and 12 can include shaft-in-pipe extensions for adjustment of the separation of keyboard halves 2 and 3 in coordination with the angle between the planes of the backs of the keyboard halves 2 and 3.

I claim:

1. An adjustment system for a split keyboard, said keyboard having right hand and left hand halves, said keyboard and system resting on a table top, comprising: a base plate, said base plate resting upon said table top; an upright post attached to said base plate; a collar on said poet, said collar sized to slide on said post; means to fix said collar at various heights above said base plate; two separate sets of stiff, double universal joints, each set connecting one of said halves of said keyboard to said collar; the connections to said collar being made at mounting locations having an angle of separation around the circumference of said collar; each half of said system being individually adjustable as to its elevation above the table top, as to its distance from an operator of the keyboard, and as to the direction in which its surface faces with respect to both the operator and the table top.

* * * * *